(12) United States Patent
Fang

(10) Patent No.: US 10,622,474 B2
(45) Date of Patent: Apr. 14, 2020

(54) LATERAL DIFFUSION METAL OXIDE SEMICONDUCTOR (LDMOS) DEVICE AND MANUFACTURE THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Lei Fang, Shanghai (CN)

(73) Assignees: SEMICONDUCTOR MANUFACTURING INTERNATIONAL (SHANGHAI) CORPORATION (CN); SEMICONDUCTOR MANUFACTURING INTERNATIONAL (BEIJING) CORPORATION (CN)

( * ) Notice: Subject to any disclaimer, the term of this patent is extended or adjusted under 35 U.S.C. 154(b) by 0 days.

(21) Appl. No.: 16/514,164

(22) Filed: Jul. 17, 2019

(65) Prior Publication Data

US 2019/0341485 A1    Nov. 7, 2019

Related U.S. Application Data

(62) Division of application No. 15/867,379, filed on Jan. 10, 2018, now Pat. No. 10,403,750.

(30) Foreign Application Priority Data

Jan. 22, 2017   (CN) .......................... 2017 1 0045044

(51) Int. Cl.
*H01L 29/78* (2006.01)
*H01L 21/26* (2006.01)
(Continued)

(52) U.S. Cl.
CPC ........ *H01L 29/7816* (2013.01); *H01L 21/266* (2013.01); *H01L 21/2652* (2013.01);
(Continued)

(58) Field of Classification Search
CPC ........... H01L 29/66659; H01L 29/7835; H01L 29/0653; H01L 29/1045; H01L 29/7816;
(Continued)

(56) References Cited

U.S. PATENT DOCUMENTS 6,102,528 A * 8/2000 Burke .................... B41J 2/0455
257/339
2011/0127612 A1* 6/2011 Cha .................. H01L 21/823412
257/368

(Continued)

*Primary Examiner* — Didarul A Mazumder
(74) *Attorney, Agent, or Firm* — Innovation Counsel LLP

(57) ABSTRACT

A Lateral Diffusion Metal Oxide Semiconductor (LDMOS) device and its manufacturing method are presented. The LDMOS device comprises a first region that has a first conductivity type; a drift region that has a second conductivity type in the first region, wherein the second conductivity type is opposite to the first conductivity type; and a plurality of second regions that have the first conductivity type in the drift region, wherein the second regions are separated from each other and extend to the first region along a depth direction of the drift region. This LDMOS device has an higher Breakdown Voltage and thus better performance than conventional LDMOS devices.

13 Claims, 5 Drawing Sheets

(51) Int. Cl.
    *H01L 29/10*     (2006.01)
    *H01L 21/265*     (2006.01)
    *H01L 29/06*     (2006.01)
    *H01L 21/266*     (2006.01)
    *H01L 29/66*     (2006.01)

(52) U.S. Cl.
    CPC ...... *H01L 29/0634* (2013.01); *H01L 29/0684* (2013.01); *H01L 29/1033* (2013.01); *H01L 29/66659* (2013.01); *H01L 29/7835* (2013.01); *H01L 29/0653* (2013.01); *H01L 29/1045* (2013.01)

(58) Field of Classification Search
    CPC ............... H01L 21/2652; H01L 21/266; H01L 29/0684; H01L 29/1033
    USPC ........................................ 257/339
    See application file for complete search history.

(56) References Cited

U.S. PATENT DOCUMENTS

2013/0207185 A1\*   8/2013   Huang .............. H01L 29/66659
                                                        257/339
2013/0320445 A1\*  12/2013   Lee .................... H01L 29/7816
                                                         257/339
2013/0341717 A1\*  12/2013   Chen ................ H01L 29/66659
                                                         257/337

\* cited by examiner

LATERAL DIFFUSION METAL OXIDE SEMICONDUCTOR (LDMOS) DEVICE AND MANUFACTURE THEREOF

CROSS-REFERENCE TO RELATED APPLICATIONS

This application is a divisional application of U.S. patent application Ser. No. 15/867,379 filed on Jan. 10, 2018, which claims priority to Chinese Patent Application No. 201710045044.X filed on Jan. 22, 2017, and all the benefits accruing therefrom under 35 U.S.C. § 119, the contents of the prior applications being herein incorporated by reference.

BACKGROUND (a) Field of the Invention

This inventive concept relates to semiconductor technology, more specifically, a Lateral Diffusion Metal Oxide Semiconductor (LDMOS) device and its manufacturing method.

(b) Description of the Related Art

LDMOS devices account for a substantial market share of power devices. In a conventional LDMOS device, a N-type drain drift region is formed by a N-type low doping process, a P-type well region is formed by a P-type doping process, and the N-type drain drift region and the P-type well region are separated from each other. With rapid development in motor and mobile devices, LDMOS device is experiencing significant advancement, and there exist many manufacturing methods for LDMOS devices of various structures and capabilities.

Advance applications, particularly mobile applications that require low power consumption, continuously push up the demand for high performance LDMOS devices. However, manufacturing a high performance LDMOS device without lowering its Breakdown Voltage (BV) is a challenging task, which requires striking a balance between a drain-source Breakdown Voltage ($BV_{ds}$) and a drain-source On-Resistance ($R_{dson}$) of the device.

SUMMARY

The inventors investigated the issues in conventional techniques and proposed an innovative solution that remedies at least one issue of the conventional techniques.

This inventive concept first presents a Lateral Diffusion Metal Oxide Semiconductor (LDMOS) device, comprising:

a first region that has a first conductivity type;

a drift region that has a second conductivity type in the first region, wherein the second conductivity type is opposite to the first conductivity type; and a plurality of second regions that have the first conductivity type, wherein the second regions are in the drift region separated from each other, and extend to the first region along a depth direction of the drift region.

Additionally, in the aforementioned device, the distance between neighboring second regions may be in a range of 0.3 µm to 0.7 µm.

Additionally, in the aforementioned device, a doping concentration of the second regions may be in a range of $2.0 \times 10^{12}$ atom/cm$^3$ to $1.0 \times 10^{13}$ atom/cm$^3$, and may be higher than a doping concentration of the drift region.

Additionally, in the aforementioned device, the first conductivity type may be P-type and the second conductivity type may be N-type, or, the first conductivity type may be N-type and the second conductivity type may be P-type.

Additionally, the aforementioned device further may comprise a well region that has the first conductivity type in the first region, and the well region and the drift region may be separated from each other.

Additionally, the aforementioned device may further comprise:

a gate structure on the first region; and a source region in the well region and a drain region in the drift region, wherein the source region and the drain region are each on a different side of the gate structure.

Additionally, the aforementioned device may further comprise:

a first groove isolation and a second groove isolation in the first region, wherein the first groove isolation is in the well region and adjacent to the source region, and the second groove isolation is in the drift region and adjacent to the drain region; and a body contact region in the well region, wherein the body contact region and the source region are each on a different side of the first groove isolation.

Additionally, in the aforementioned device, the gate structure may comprise a gate insulation layer on the first region, a gate on the gate insulation layer, and a spacer on a side surface of the gate, with a portion of the gate and a portion of the spacer on the second groove isolation.

This inventive concept further presents a LDMOS device manufacturing method, comprising:

providing a semiconductor structure, wherein the semiconductor structure comprises a first region that has a first conductivity type;

forming a drift region that has a second conductivity type in the first region, wherein the second conductivity type is opposite to the first conductivity type; and forming a plurality of second regions that have the first conductivity type by conducting a doping process on the semiconductor structure, wherein the second regions are formed in the drift region separated from each other, and extend to the first region along a depth direction of the drift region.

Additionally, in the aforementioned method, the distance between neighboring second regions may be in a range of 0.3 µm to 0.7 µm.

Additionally, in the aforementioned method, a doping concentration of the second regions may be in a range of $2.0 \times 10^{12}$ atom/cm$^3$ to $1.0 \times 10^{13}$ atom/cm$^3$, and may be higher than a doping concentration of the drift region.

Additionally, in the aforementioned method, the doping process on the semiconductor structure may be an ion implantation process, and the energy of the ion implantation process may be in a range of 500 keV to 800 keV, and in the aforementioned method, the first conductivity type may be P-type, the second conductivity type may be N-type, and a dopant used in the ion implantation process may be a P-type dopant, or, the first conductivity type may be N-type, the second conductivity type may be P-type, and a dopant used in the ion implantation may be a N-type dopant.

Additionally, in the aforementioned method, forming a plurality of second regions by conducting a doping process on the semiconductor structure may comprise:

forming a patterned hard mask layer on the semiconductor structure, wherein the patterned hard mask layer has a plurality of openings on the drift region exposing the semiconductor structure;

forming a plurality of second regions by conducting a doping process on the semiconductor structure through the openings; and removing the hard mask layer.

Additionally, the aforementioned method may further comprise forming a well region that has the first conductivity type in the first region when forming the drift region, wherein the well region and the drift region are separated from each other.

Additionally, the aforementioned method may further comprise:

forming a gate structure on the first region; and forming a source region in the well region and a drain region in the drift region, wherein the source region and the drain region are each on a different side of the gate structure.

Additionally, in the aforementioned method, the semiconductor structure may further comprise a first groove isolation and a second groove isolation in the first region, wherein after the drift region is formed, the second groove isolation is in the drift region, and after the well region is formed, the first groove isolation is in the well region, and wherein the source region is formed adjacent to the first groove isolation, and the drain region is formed adjacent to the second groove isolation.

Additionally, in the aforementioned method, when forming a plurality of second regions, the doping process on the semiconductor structure to form the second regions may be conducted on the second groove isolation.

Additionally, the aforementioned method may further comprise forming a body contact region in the well region, wherein the body contact region and the source region are each on a different side of the first groove isolation.

Additionally, in the aforementioned method, the gate structure may comprise:

a gate insulation layer on the first region;

a gate on the gate insulation layer; and a spacer on a side surface of the gate, wherein a portion of the gate and a portion of the spacer are on the second groove isolation.

BRIEF DESCRIPTION OF THE DRAWINGS

The drawings, as part of this application, illustrate some embodiments of this inventive concept and will be used to describe this inventive concept along with the specification.

DETAILED DESCRIPTION OF THE EMBODIMENTS

Figure 1:
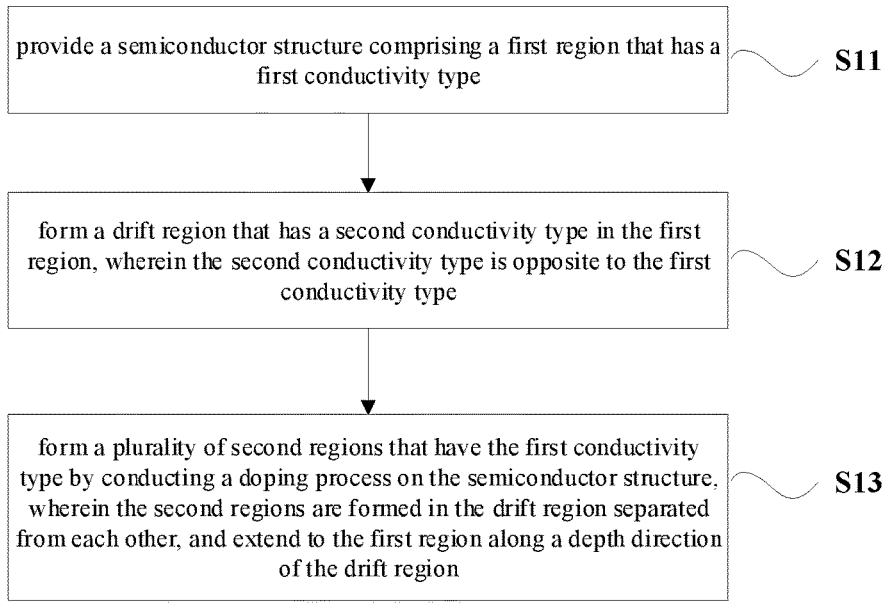
FIG. 1 shows a flowchart illustrating a LDMOS device manufacturing method in accordance with one or more embodiments of this inventive concept.

Example embodiments of the inventive concept are described with reference to the accompanying drawings. As those skilled in the art would realize, the described embodiments may be modified in various ways without departing from the spirit or scope of the inventive concept. Embodiments may be practiced without some or all of these specified details. Well known process steps and/or structures may not be described in detail, in the interest of clarity.

The drawings and descriptions are illustrative and not restrictive. Like reference numerals may designate like (e.g., analogous or identical) elements in the specification. To the extent possible, any repetitive description will be minimized.

Relative sizes and thicknesses of elements shown in the drawings are chosen to facilitate description and understanding, without limiting the inventive concept. In the drawings, the thicknesses of some layers, films, panels, regions, etc., may be exaggerated for clarity.

Embodiments in the figures may represent idealized illustrations. Variations from the shapes illustrated may be possible, for example due to manufacturing techniques and/or tolerances. Thus, the example embodiments shall not be construed as limited to the shapes or regions illustrated herein but are to include deviations in the shapes. For example, an etched region illustrated as a rectangle may have rounded or curved features. The shapes and regions illustrated in the figures are illustrative and shall not limit the scope of the embodiments.

Although the terms "first," "second," etc. may be used herein to describe various elements, these elements shall not be limited by these terms. These terms may be used to distinguish one element from another element. Thus, a first element discussed below may be termed a second element without departing from the teachings of the present inventive concept. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

If a first element (such as a layer, film, region, or substrate) is referred to as being "on," "neighboring," "connected to," or "coupled with" a second element, then the first element can be directly on, directly neighboring, directly connected to or directly coupled with the second element, or an intervening element may also be present between the first element and the second element. If a first element is referred to as being "directly on," "directly neighboring," "directly connected to," or "directly coupled with" a second element, then no intended intervening element (except environmental elements such as air) may also be present between the first element and the second element.

Spatially relative terms, such as "beneath," "below," "lower," "above," "upper," and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientation), and the spatially relative descriptors used herein shall be interpreted accordingly.

The terminology used herein is for the purpose of describing particular embodiments and is not intended to limit the inventive concept. As used herein, singular forms, "a," "an," and "the" may indicate plural forms as well, unless the context clearly indicates otherwise. The terms "includes" and/or "including," when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as what is commonly understood by one of ordinary skill in the art related to this field. Terms, such as those defined in commonly used dictionaries, shall be interpreted as having meanings that are consistent with their meanings in the context of the relevant art and shall not be interpreted in an idealized or overly formal sense unless expressly so defined herein.

The term "connect" may mean "electrically connect." The term "insulate" may mean "electrically insulate."

Unless explicitly described to the contrary, the word "comprise" and variations such as "comprises," "comprising," "include," or "including" may imply the inclusion of stated elements but not the exclusion of other elements.

Various embodiments, including methods and techniques, are described in this disclosure. Embodiments of the inventive concept may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the inventive concept may also cover apparatuses for practicing embodiments of the inventive concept. Such apparatus may include circuits, dedicated and/or programmable, to carry out operations pertaining to embodiments of the inventive concept. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the inventive concept.

FIG. 1 shows a flowchart illustrating a LDMOS device manufacturing method in accordance with one or more embodiments of this inventive concept.

In step S11, a semiconductor structure is provided. The semiconductor device comprises a first region that has a first conductivity type.

In step S12, a drift region that has a second conductivity type is formed in the first region. The second conductivity type is opposite to the first conductivity type.

In step S13, a plurality of second regions that have the first conductivity type are formed by conducting a doping process on the semiconductor structure. The plurality of second regions are formed in the drift region separated from each other, and extend to the first region along a depth direction of the drift region.

In this LDMOS device manufacturing method, a plurality of second regions separated from each other are formed. These second regions are formed in the drift region and extend to the first region along a depth direction of the drift region. When a voltage is applied on the LDMOS device, these second regions can increase the width of a depletion region between the drift region and a well region of the device, which makes the electric field sparser and thus lowers the electric field density in the depletion region. Therefore, this manufacturing method can increase the drain-source Breakdown Voltage ($BV_{ds}$) of the LDMOS device and improve its performance.

FIGS. 2, 3, 4, 5, 6, 7, and 8 show schematic sectional views illustrating different stages of a LDMOS device manufacturing method in accordance with one or more embodiments of this inventive concept. This LDMOS device manufacturing method is described below in reference to these drawings.

Figure 2:
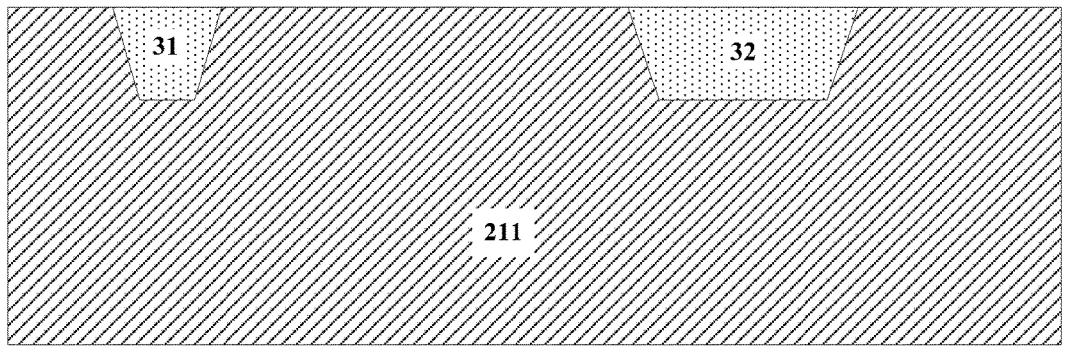
FIGS. 2, 3, 4, 5, 6, 7, and 8 show schematic sectional views illustrating different stages of a LDMOS device manufacturing method in accordance with one or more embodiments of this inventive concept.

First, referring to FIG. 2, a semiconductor structure is provided. The semiconductor structure comprises a first region 211 that has a first conductivity type. The first region 211 may be formed by conducting a doping process on a semiconductor substrate (e.g., a silicon substrate). The first conductivity type can be either P-type or N-type. Referring to FIG. 2, in one embodiment, the semiconductor structure may further comprise a first groove isolation 31 and a second groove isolation 32 in the first region 211. For example, both the first groove isolation 31 and the second groove isolation 32 may be a Shallow Trench Isolation (STI). That is, the first groove isolation 31 and the second groove isolation 32 can each comprise a groove in the first region 211 and an insulation layer (e.g., silicon dioxide) filling the groove.

Figure 3:
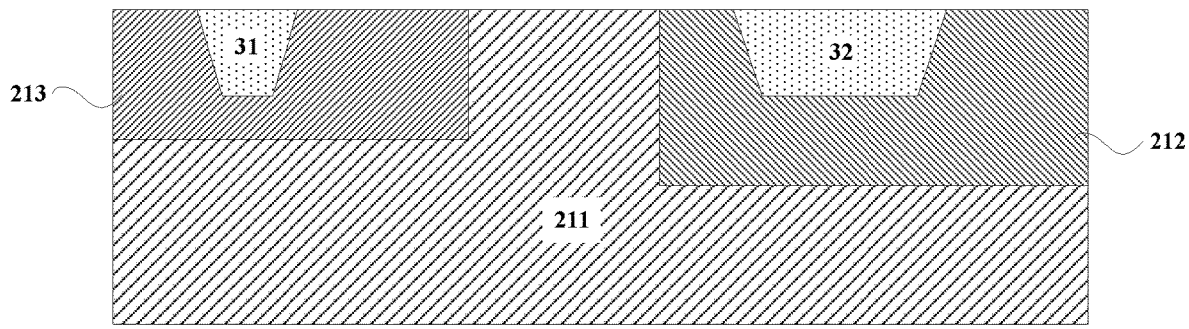

Next, referring to FIG. 3, a drift region 212 that has a second conductivity type is formed in the first region 211. The second conductivity type is opposite to the first conductivity type. Referring to FIG. 3, in one embodiment, when forming the drift region 212, the LDMOS device manufacturing method further comprises: forming a well region 213 that has the first conductivity type in the first region 211. The well region 213 and the drift region 212 are separated from each other. For example, they can be separated by a portion of the first region 211.

In one embodiment, the first conductivity type is P-type and the second conductivity type is N-type, that is, the first region 211 is a P-type region, the drift region 212 is a N-type drift region, and the well region 213 is a P-type well region. In another embodiment, the first conductivity type is N-type and the second conductivity type is P-type, that is, the first region 211 is a N-type region, the drift region 212 is a P-type drift region, and the well region 213 is a N-type well region.

In one embodiment, the drift region 212 that has the second conductivity type and the well region 213 that has the first conductivity type may be formed in the first region 211 through a doping process (e.g., ion implantation). A doping concentration of the drift region 212 and a doping concentration of the well region 213 are both higher than a doping concentration of the first region 211.

In one embodiment, the drift region 212 may first be formed through a first doping process (e.g., ion implantation), and then the well region 213 is formed through a second doping process (e.g., ion implantation). In another embodiment, the well region 213 may first be formed through a second doping process (e.g., ion implantation), and then the drift region 212 is formed through a first doping process (e.g., ion implantation). Therefore, the order in which the drift region 212 and the well region 213 are formed is not limited herein.

Referring to FIG. 3, in some embodiments, the second groove isolation 32 is in the drift region 212 after the drift region 212 is formed, and the first groove isolation 31 is in the well region 213 after the well region 213 is formed. That is, the first doping process may be conducted on the second groove isolation 32 to form the drift region 212, and the second doping process may be conducted on the first groove isolation 31 to form the well region 213.

Next, a plurality of second regions that have the first conductivity type are formed by conducting a doping process on the semiconductor structure. The plurality of second regions are formed in the drift region separated from each other, and extend to the first region along a depth direction of the drift region.

The process to form a plurality of second regions is described below in reference to FIGS. 4 and 5.

Figure 4:
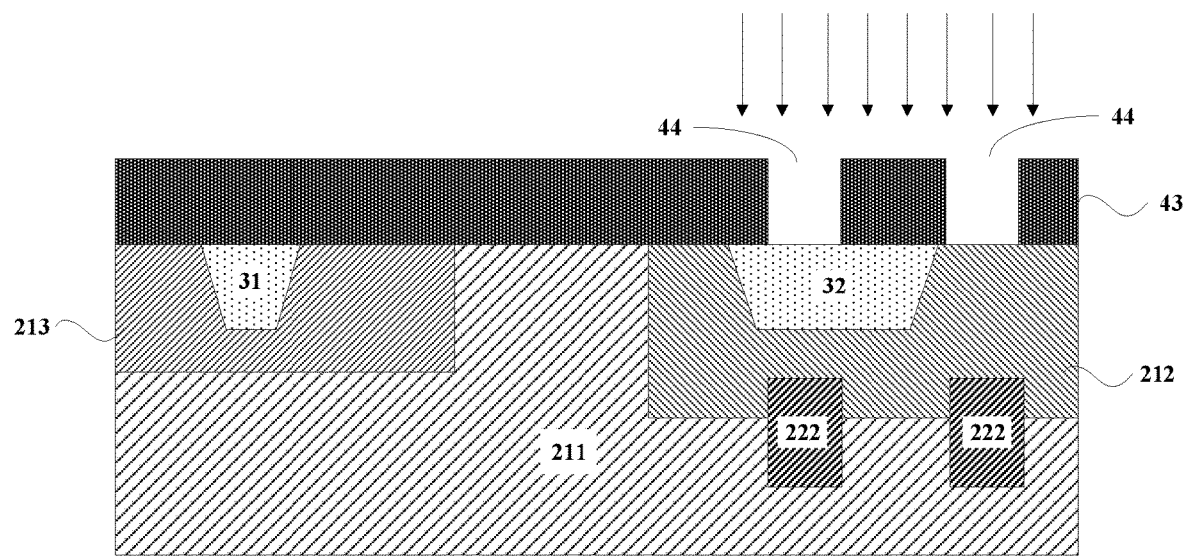

Referring to FIG. 4, the process to form a plurality of second regions may comprise: forming a patterned hard mask layer 43 (e.g., photoresist) on the semiconductor structure. The patterned hard mask layer 43 has a plurality of openings 44 on the drift region 212 exposing the semiconductor structure. (two openings 44 are shown in FIG. 4).

Referring to FIG. 4, the process to form a plurality of second regions may further comprise: forming a plurality of second regions 222 by conducting a doping process on the semiconductor structure through the openings 44. In some embodiments, the doping process on the semiconductor structure may be conducted on the second groove isolation 32 to form the second regions 222, thus some of the second regions 222 will be formed right beneath the second groove isolation 32, as shown in FIG. 4.

In some embodiments, the doping process conducted on the semiconductor structure to form the second regions 222 may be an ion implantation process, the energy of the ion implantation process may be determined by the depth of the drift region 212 to ensure that the second regions are formed in the drift region and extend into the first region along the depth direction of the drift region. For example, the energy of the ion implantation process may be in a range of 500 keV to 800 keV (e.g., 600 keV or 700 keV).

When the first conductivity type is P-type and the second conductivity type is N-type (that is, the first region 211 is P-type and the drift region 212 is N-type), a dopant used in the ion implantation process is a P-type dopant (e.g., a dopant comprising boron), and the second regions 222 are P-type; when the first conductivity type is N-type and the second conductivity type is P-type (that is, the first region 211 is N-type and the drift region 212 is P-type), a dopant used in the ion implantation process is a N-type dopant (e.g., a dopant comprising phosphorus or arsenic), and the second regions 222 are N-type.

The second regions 222 have the first conductivity type, which is the same as the conductivity type of the first region 211 and opposite to the conductivity type of the drift region 212. FIG. 4 only shows two second regions 222, a person having ordinary skill in the art in this field, however, would understand that the number of the second regions 222 may be greater than 2 (e.g., 3 or 4). The second regions 222 are separated from each other and form an approximate claw geometry.

In one embodiment, a doping concentration of the second regions 222 is higher than the doping concentration of the drift region 212. For example, the doping concentration of the second regions 222 may be in a range of $2.0 \times 10^{12}$ atom/cm$^3$ to $1.0 \times 10^{13}$ atom/cm$^3$ (e.g., $4.0 \times 10^{12}$ atom/cm$^3$, $6.0 \times 10^{12}$ atom/cm$^3$, or $8.0 \times 10^{12}$ atom/cm$^3$). The doping concentration of the second regions 222 should not be too large, otherwise neighboring second regions 222 may merge together.

In one embodiment, the distance between neighboring second regions 222 may be determined by the doping concentration of the second regions 222. For example, the distance between neighboring second regions 222 may be in a range of 0.3 μm to 0.7 μm (e.g., 0.4 μm, 0.5 μm, or 0.6 μm).

Figure 5:
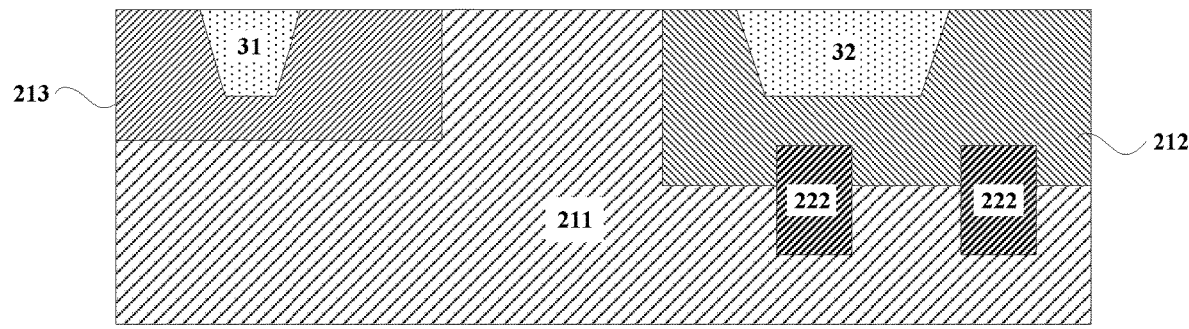

Referring to FIG. 5, the process to form a plurality of second regions may further comprise: removing the hard mask layer 43. Through the processes described above, a plurality of second regions 222 are formed in the semiconductor structure.

Figure 6:
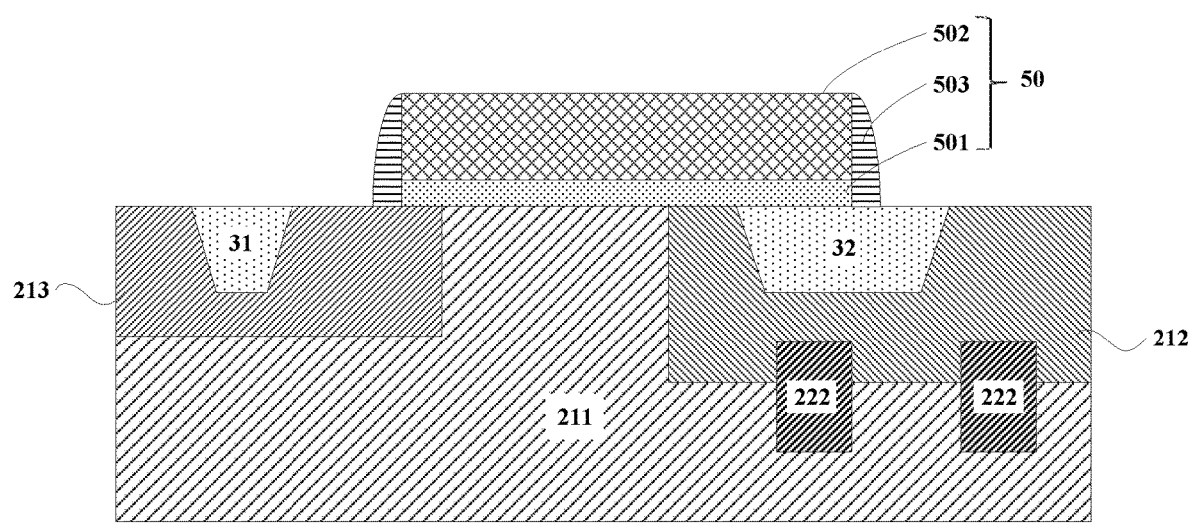

Next, referring to FIG. 6, the LDMOS device manufacturing method may further comprise: forming a gate structure 50 on the first region 511. The gate structure 50 may comprise: a gate insulation layer 501 (e.g., silicon oxide) on the first region 211, a gate 502 (e.g., poly-silicon) on the gate insulation layer 501, and a spacer 503 (e.g., silicon oxide or silicon nitride) on a side surface of the gate 502. A portion of the gate 502 and a portion of the spacer 503 are on the second groove isolation 32.

Figure 7:
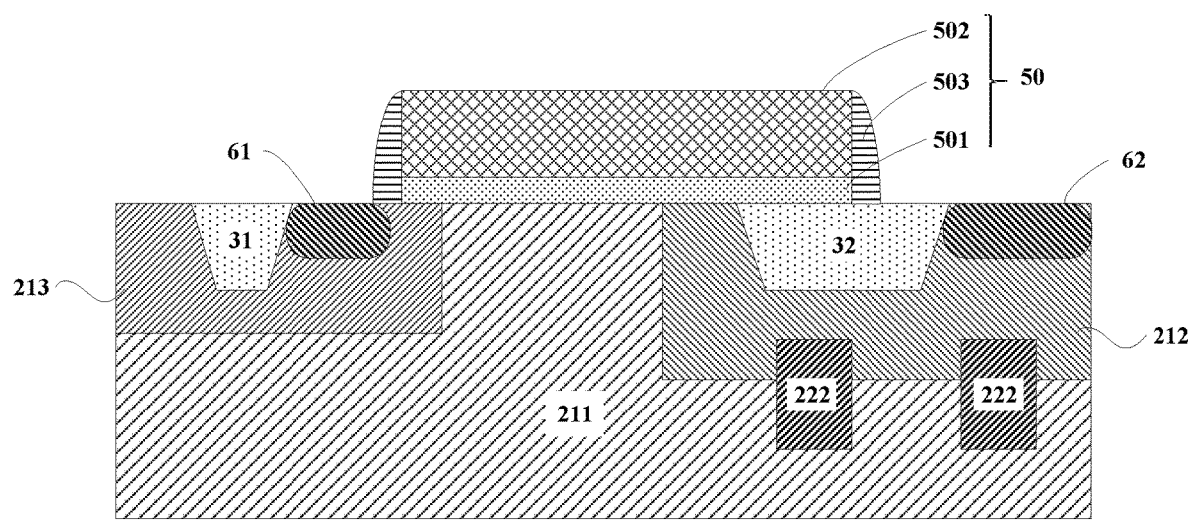

Next, referring to FIG. 7, the LDMOS device manufacturing method may further comprise: forming a source region 61 in the well region 213 and a drain region 62 in the drift region 212 by conducting a doping process. The source region 61 and the drain region 62 are each on a different side of the gate structure 50 and both have the second conductivity type. That is, when the drift region 212 is a N-type drift region and the well region 213 is a P-type well region, the conductivity types of both the source region 61 and the drain region 62 are N-type; when the drift region 212 is a P-type drift region and the well region 213 is a N-type well region, the conductivity types of both the source region 61 and the drain region 62 are P-type. A doping concentration of the source region 61 is higher than the doping concentration of the well region 213, and a doping concentration of the drain region 62 is higher than the doping concentration of the drift region 212. Referring to FIG. 7, the source region 61 is formed adjacent to the first groove isolation 31, and the drain region 62 is formed adjacent to the second groove isolation 32.

Figure 8:
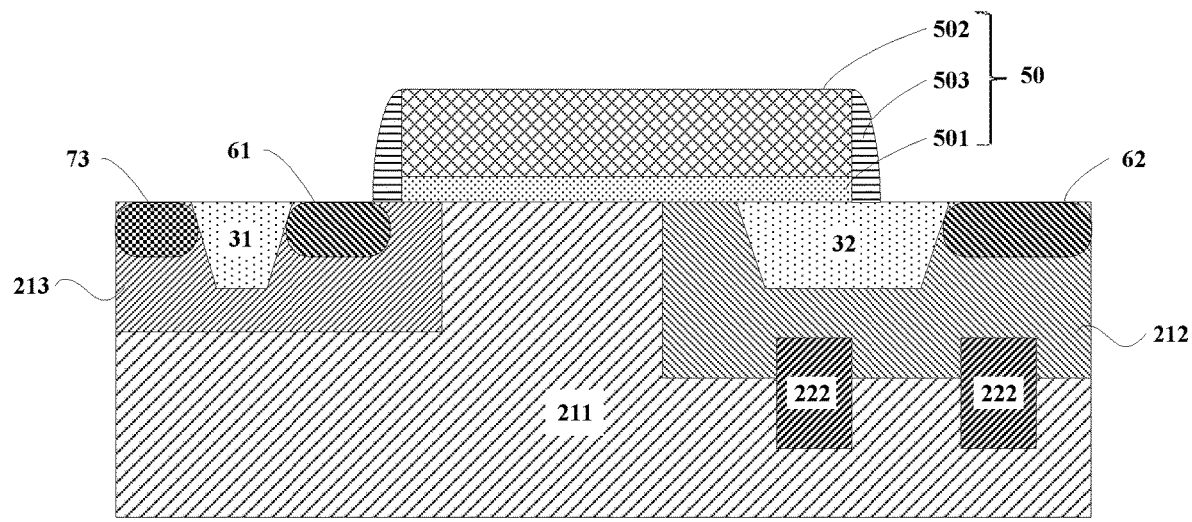

Next, referring to FIG. 8, the LDMOS device manufacturing method may further comprise: forming a body contact region 73 in the well region 213. The body contact region 73 and the source region 61 are each on a different side of the first groove isolation 31. The body contact region 73 has the first conductivity type, the same conductivity type of the well region 213. In one embodiment, a doping concentration of the body contact region 73 is higher than the doping concentration of the well region 213. The body contact region 213 can lower the contact resistance of the device.

This concludes the description of a LDMOS device manufacturing method in accordance with one or more embodiments of this inventive concept. This manufacturing method increases the drain-source Breakdown Voltage ($BV_{ds}$) of the LDMOS device and thus improves its performance.

Based on the LDMOS device manufacturing method described above, this inventive concept further presents a LDMOS device. Referring to FIG. 8, the LDMOS device comprises a first region 211 that has a first conductivity type.

Referring to FIG. 8, the LDMOS device may further comprise a drift region 212 that has a second conductivity type in the first region 211, the second conductivity type is opposite to the first conductivity type.

Referring to FIG. 8, the LDMOS device may further comprise a plurality (i.e., at least two) of second regions 222 that have the first conductivity types. The second regions 222 are in the drift region 212 separated from each other, and extend to the first region 211 along a depth direction of the drift region 212.

In one embodiment, the distance between neighboring second regions 222 may be in a range of 0.3 µm to 0.7 µm (e.g., 0.4 µm, 0.5 µm, or 0.6 µm).

In one embodiment, a doping concentration of the second regions 222 is higher than a doping concentration of the drift region 212. For example, the doping concentration of the second regions 222 may be in a range of $2.0\times10^{12}$ atom/cm$^3$ to $1.0\times10^{13}$ atom/cm$^3$ (e.g., $4.0\times10^{12}$ atom/cm$^3$, $6.0\times10^{12}$ atom/cm$^3$, or $8.0\times10^{12}$ atom/cm$^3$).

Referring to FIG. 8, in one embodiment, the LDMOS device may further comprise a well region 213 that has the first conductivity type in the first region 211. The drift region 212 and the well region 213 are separated from each other.

In one embodiment, the first conductivity type is P-type and the second conductivity type is N-type, that is, the first region 211 is a P-type region, the drift region 212 is a N-type drift region, the well region 213 is a P-type well region, and the second regions 222 are P-type regions. In another embodiment, the first conductivity type is N-type and the second conductivity type is P-type, that is, the first region 211 is a N-type region, the drift region 212 is a P-type drift region, the well region 213 is a N-type well region, and the second regions 222 are N-type regions.

Referring to FIG. 8, in one embodiment, the LDMOS device may further comprise a gate structure 50 on the first region 211. The gate structure 50 may comprise: a gate insulation layer 501 on the first region 211, a gate 502 on the gate insulation layer 501, and a spacer 503 on a side surface of the gate 502.

Referring to FIG. 8, in one embodiment, the LDMOS device may further comprise a source region 61 in the well region 213 and a drain region 62 in the drift region 212, the source region 61 and the drain region 62 are each on a different side of the gate structure 50.

Referring to FIG. 8, in one embodiment, the LDMOS device may further comprise a first groove isolation 31 and a second groove isolation 32 in the first region 211. The first groove isolation 31 is in the well region 213 and adjacent to the source region 61, and the second groove isolation 32 is in the drift region 212 and adjacent to the drain region 62. Referring to FIG. 8, in one embodiment, a portion of the gate 502 and a portion of the spacer 503 are on the second groove isolation 32.

Referring to FIG. 8, in one embodiment, the LDMOS device may further comprise a body contact region 73 in the well region 213. The body contact region 73 and the source region 61 are each on a different side of the first groove isolation 31. In one embodiment, a doping concentration of the body contact region 73 is higher than a doping concentration of the well region 213. The body contact region 213 can lower the contact resistance of the device.

The LDMOS device described above has a plurality of second regions 222. When a voltage is applied on the LDMOS device, these second regions can increase the width of a depletion region between the drift region and the well region, which makes the electric field sparser and thus lowers the electric field density in the depletion region. Therefore, the drain-source Breakdown Voltage ($BV_{ds}$) of the LDMOS device can be increased, which improves its performance.

Figure 9A:
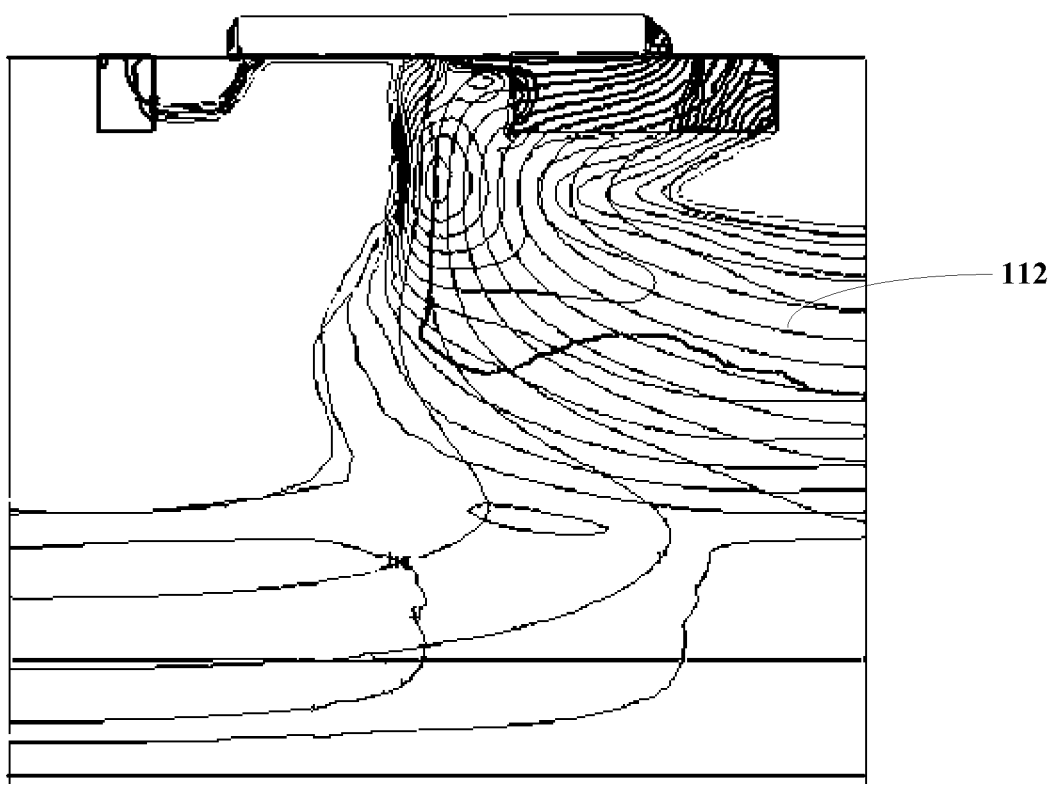
FIG. 9A illustrates an electric field of a conventional LDMOS device.
Figure 9B:
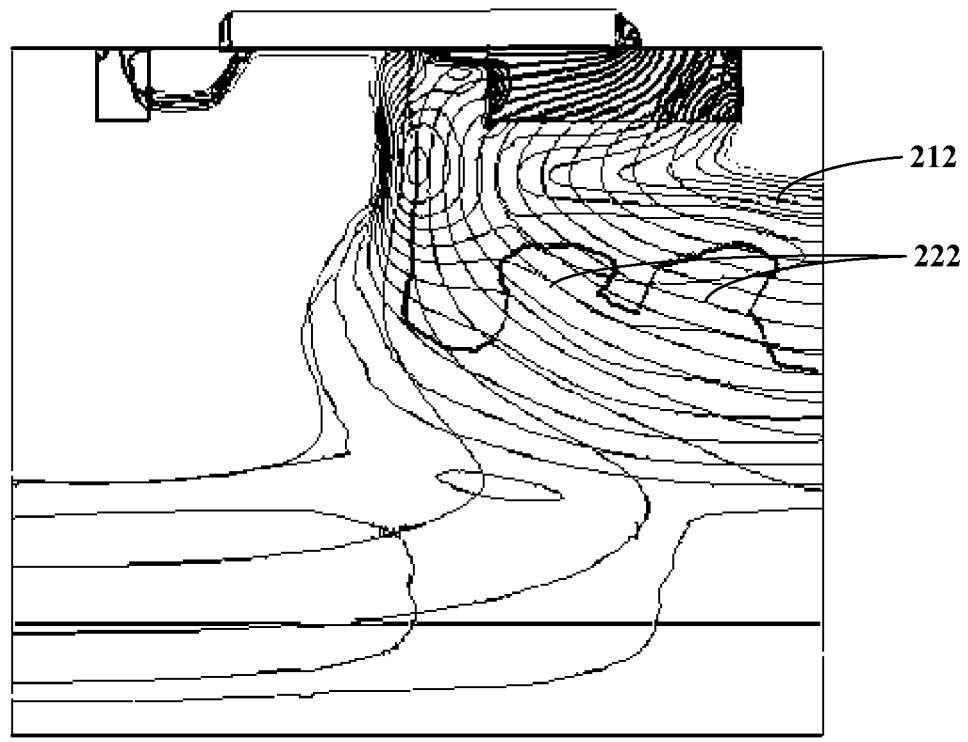
FIG. 9B illustrates an electric field of a LDMOS device in accordance with one or more embodiments of this inventive concept.

FIG. 9A illustrates an electric field of a conventional LDMOS device. A drift region 112 is marked in FIG. 9A. The conventional LDMOS device shown in FIG. 9A does not have a plurality of the second regions as described in this application. The electric field lines after a voltage is applied on the conventional LDMOS device are shown in FIG. 9A. FIG. 9B illustrates an electric field of a LDMOS device in accordance with one or more embodiments of this inventive concept. A drift region 212 and two second regions 222 are marked in FIG. 9B. The electric field lines after a voltage is applied on the LDMOS device of this inventive concept are shown in FIG. 9B. Comparing FIG. 9A with FIG. 9B, the electric field lines in FIG. 9B are sparser than those in FIG. 9A, indicating a sparser electric field in FIG. 9B, which allows a higher Breakdown Voltage for the LDMOS device.

Figure 10:
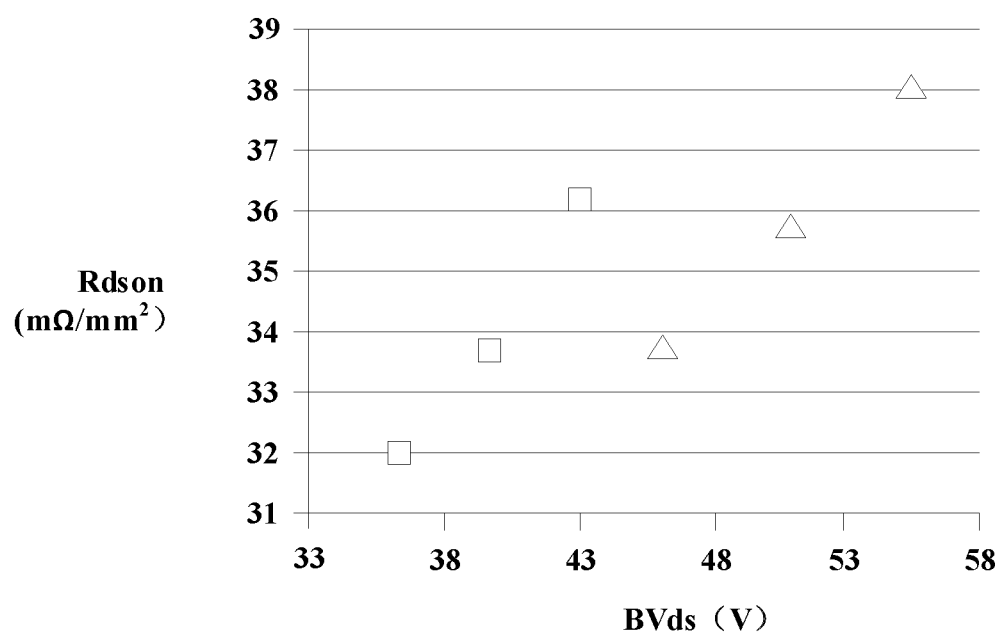
FIG. 10 illustrates the relationship between the drain-source Breakdown Voltage ($BV_{ds}$) and the drain-source On-Resistance ($R_{dson}$) for a conventional LDMOS device and a LDMOS device in accordance with one or more embodiments of this inventive concept.

FIG. 10 illustrates the relationship between the drain-source Breakdown Voltage ($BV_{ds}$) and the drain-source On-Resistance ($R_{dson}$) for a conventional LDMOS device and a LDMOS device in accordance with one or more embodiments of this inventive concept. Square marks represent a conventional LDMOS device (e.g., LDMOS device without the second regions) and triangle marks represent a LDMOS device in accordance with one or more embodiments of this inventive concept (e.g., LDMOS device with a plurality of second regions). FIG. 10 shows that, under a same drain-source On-Resistance ($R_{dson}$), the drain-source Breakdown Voltage ($BV_{ds}$) in a LDMOS device of this inventive concept is higher than that of a conventional LDMOS device, and under a same drain-source Breakdown Voltage ($BV_{ds}$), the drain-source On-Resistance ($R_{dson}$) in a LDMOS device of this inventive concept is lower than that of a conventional LDMOS device. Therefore, comparing with a conventional LDMOS device, the LDMOS device of this inventive concept can either offer a higher Breakdown Voltage without sacrificing the performance (i.e., increasing the drain-source On-Resistance ($R_{dson}$)), or alternately, offer improved performance (i.e., smaller drain-source On-Resistance ($R_{dson}$)) under a same Breakdown Voltage. Therefore the LDMOS device of this inventive concept offers higher performance than a conventional LDMOS device.

This concludes the description of a semiconductor device and its manufacturing method in accordance with one or more embodiments of this inventive concept. For purposes of conciseness and convenience, some components or procedures that are well known to one of ordinary skill in the art in this field are omitted. These omissions, however, do not prevent one of ordinary skill in the art in this field to make and use the inventive concept herein disclosed.

While this inventive concept has been described in terms of several embodiments, there are alterations, permutations, and equivalents, which fall within the scope of this disclosure. It shall also be noted that there are alternative ways of implementing the methods and/or apparatuses of the inventive concept. Furthermore, embodiments may find utility in other applications. It is therefore intended that the claims be interpreted as including all such alterations, permutations, and equivalents. The abstract section is provided herein for convenience and, due to word count limitation, is accordingly written for reading convenience and shall not be employed to limit the scope of the claims.

What is claimed is:

1. A Lateral Diffusion Metal Oxide Semiconductor (LDMOS) device manufacturing method, comprising:
   providing a semiconductor structure, wherein the semiconductor structure comprises a first region that has a first conductivity type;
   forming a drift region that has a second conductivity type in the first region, wherein the second conductivity type is opposite to the first conductivity type; and
   forming a plurality of second regions that have the first conductivity type by conducting a doping process on the semiconductor structure, wherein the plurality of second regions are formed in the drift region separated from each other, and extended to the first region along a depth direction of the drift region.

2. The method of claim 1, wherein the distance between neighboring second regions of the plurality of second regions is in a range of 0.3 µm to 0.7 µm.

3. The method of claim 1, wherein a doping concentration of the plurality of second regions is higher than a doping concentration of the drift region.

4. The method of claim 1, wherein a doping concentration of the plurality of second regions is in a range of $2.0 \times 10^{12}$ atom/cm$^3$ to $1.0 \times 10^{13}$ atom/cm$^3$.

5. The method of claim 1, wherein the doping process on the semiconductor structure is an ion implantation process, and an energy of the ion implantation process is in a range of 500 keV to 800 keV, and wherein the first conductivity type is P-type, the second conductivity type is N-type, and a dopant used in the ion implantation process is a P-type dopant, or, the first conductivity type is N-type, the second conductivity type is P-type, and a dopant used in the ion implantation is a N-type dopant.

6. The method of claim 1, wherein forming a plurality of second regions by conducting a doping process on the semiconductor structure comprises:

forming a patterned hard mask layer on the semiconductor structure, wherein the patterned hard mask layer has a plurality of openings on the drift region exposing the semiconductor structure;

forming the plurality of second regions by conducting the doping process on the semiconductor structure through the openings; and removing the patterned hard mask layer.

7. The method of claim 1, further comprising:

forming a well region that has the first conductivity type in the first region when forming the drift region, wherein the well region and the drift region are separated from each other.

8. The method of claim 7, further comprising:

forming a gate structure on the first region; and forming a source region in the well region and a drain region in the drift region, wherein the source region and the drain region are each on a different side of the gate structure.

9. The method of claim 8, wherein the semiconductor structure further comprises a first groove isolation and a second groove isolation in the first region, wherein after the drift region is formed, the second groove isolation is in the drift region, and after the well region is formed, the first groove isolation is in the well region, and wherein the source region is formed adjacent to the first groove isolation, and the drain region is formed adjacent to the second groove isolation.

10. The method of claim 9, wherein when forming the plurality of second regions, the doping process on the semiconductor structure to form the plurality of second regions is conducted on the second groove isolation.

11. The method of claim 9, further comprising:

forming a body contact region in the well region, wherein the body contact region and the source region are each on a different side of the first groove isolation.

12. The method of claim 9, wherein the gate structure comprises:

a gate insulation layer on the first region;

a gate on the gate insulation layer; and a spacer on a side surface of the gate, wherein a portion of the gate and a portion of the spacer are on the second groove isolation.

13. The method of claim 1, each of the plurality of second regions is separated from each other and consists of a lower part and an upper part on the lower part, with the lower part located in the first region, the upper part located in the drift region and having a same width as the lower part.

* * * * *